United States Patent
McCombs, Jr.

(10) Patent No.: US 11,967,360 B2
(45) Date of Patent: Apr. 23, 2024

(54) DYNAMICALLY ADJUSTABLE PIPELINE FOR MEMORY ACCESS

(71) Applicant: Arm Limited, Cambridge (GB)

(72) Inventor: Edward Martin McCombs, Jr., Austin, TX (US)

(73) Assignee: Arm Limited, Cambridge (GB)

(*) Notice: Subject to any disclaimer, the term of this patent is extended or adjusted under 35 U.S.C. 154(b) by 63 days.

(21) Appl. No.: 17/482,298

(22) Filed: Sep. 22, 2021

(65) Prior Publication Data

US 2023/0092241 A1  Mar. 23, 2023

(51) Int. Cl.
| | |
|---|---|
| *G11C 7/10* | (2006.01) |
| *G11C 11/4072* | (2006.01) |
| *G11C 11/408* | (2006.01) |
| *G11C 11/4093* | (2006.01) |
| *G11C 11/4094* | (2006.01) |
| *G11C 11/4096* | (2006.01) |

(52) U.S. Cl.
CPC ...... *G11C 11/4087* (2013.01); *G11C 11/4072* (2013.01); *G11C 11/4085* (2013.01); *G11C 11/4093* (2013.01); *G11C 11/4094* (2013.01); *G11C 11/4096* (2013.01)

(58) Field of Classification Search
CPC ............ G11C 11/4087; G11C 11/4072; G11C 11/4085; G11C 11/4093; G11C 11/4094; G11C 11/4096
See application file for complete search history.

(56) References Cited

U.S. PATENT DOCUMENTS

| | | | | |
|---|---|---|---|---|
| 7,800,974 | B2* | 9/2010 | Zhang ................ | G06F 12/0855 365/194 |
| 2006/0018171 | A1* | 1/2006 | Austin ................ | G06F 11/141 365/205 |
| 2008/0016321 | A1* | 1/2008 | Pennock ............... | G06F 9/3867 712/35 |
| 2009/0213668 | A1* | 8/2009 | Zhang ................ | G06F 12/0855 365/189.011 |
| 2015/0348605 | A1* | 12/2015 | Jang ..................... | G11C 29/022 365/230.02 |
| 2018/0367460 | A1* | 12/2018 | Gao ......................... | G06F 9/50 |
| 2021/0191725 | A1* | 6/2021 | Carlson ................ | G06F 9/3869 |

* cited by examiner

*Primary Examiner* — Mushfique Siddique
(74) *Attorney, Agent, or Firm* — Pramudji Law Group PLLC; Ari Pramudji

(57) ABSTRACT

Various implementations described herein are directed to a method. The method may receive an address to access data stored in memory. The method may enable a data access pipeline to perform memory access operations so as to access the data stored in the memory based on the address. The method may dynamically adjust the data access pipeline during the memory access operations so as to output the data based on the address.

14 Claims, 3 Drawing Sheets

DYNAMICALLY ADJUSTABLE PIPELINE FOR MEMORY ACCESS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, many memory devices utilize a fixed pipeline along with a single-clock cycle design, and as such, these conventional memory devices typically have a statically unchangeable pipeline. The fixed-pipeline refers to an internal data pipeline in the memory devices that is unmodifiable, and when using this fixed-pipeline technique, the conventional memory device is typically used in low speed memory applications. Thus, there exists a need to improve the speed and efficiency of integrated pipeline designs that enhance power and performance targets in modern conventional circuitry.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to dynamically adjustable pipeline architecture for various memory access schemes and techniques that support applications in reference to physical circuit designs. Various applications related to area optimal dynamic pipeline circuitry may be used in memory applications that are configured to dynamically change (or modify, or adjust) its pipeline in real-time based on demand and/or changes in system requirements when operating in real-time. Also, the various schemes and techniques described herein may provide for a dynamically adjustable pipeline that uses a multi-clock cycle design. Thus, various aspects of the present disclosure describe a pipeline that dynamically changes, and this pipeline operates by changing the internal data pipeline of memory based on an input into the memory. By using this technique, the memory may be used for low power and/or high speed applications.

Various implementations of providing dynamically adjustable pipeline architecture for memory access operations will be described herein with reference to FIGS. 1-3.

Figure 1:
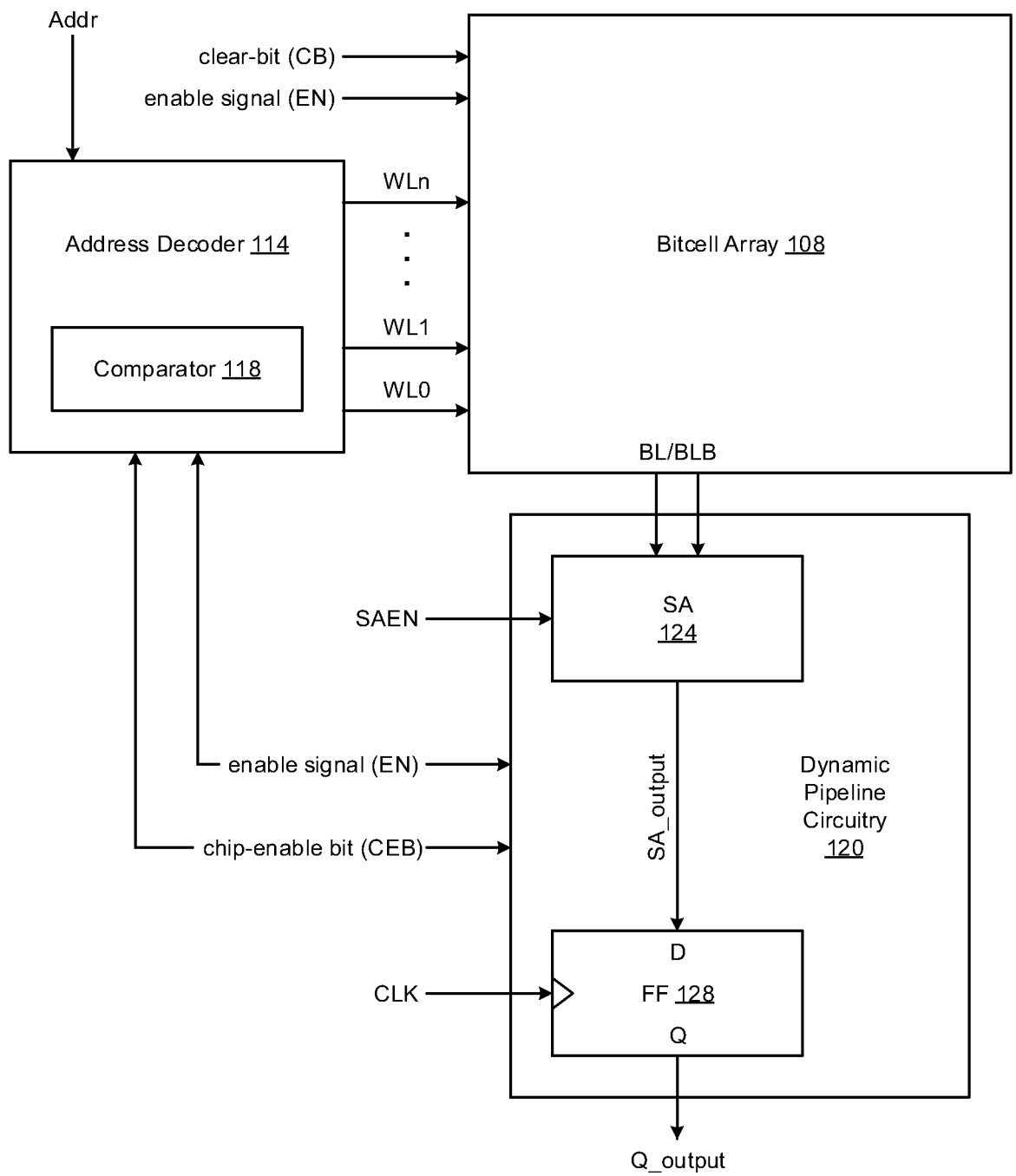
FIG. 1 illustrates a diagram of dynamically adjustable pipeline architecture for memory access in accordance with various implementations described herein.

FIG. 1 illustrates a diagram 100 of dynamically adjustable pipeline architecture 104 for memory access in accordance with various implementations described herein.

In various implementations, dynamically adjustable pipeline architecture may be implemented as a system or a device having various integrated circuit (IC) components that are arranged and coupled together as an assemblage or a combination of parts that provide for physical circuit designs and related structures. In some instances, a method of designing, providing, fabricating and/or manufacturing dynamically adjustable pipeline architecture as an integrated system or device may involve use of various IC circuit components described herein to implement various related fabrication schemes and techniques associated therewith. Also, the dynamically adjustable pipeline architecture may be integrated with various computing circuitry and components on a single chip, and further, the dynamically adjustable pipeline architecture may be implemented and/or incorporated in various types of embedded systems for automotive, computer, electronic, mobile phones, server and Internet-of-things (IoT) applications, including remote sensor nodes.

As shown in FIG. 1, the dynamically adjustable pipeline architecture 104 may be referred to as memory circuitry with an array of bitcells 108 that is configured to store data. Also, the dynamically adjustable pipeline architecture 104 (or memory circuitry) may have address decoder circuitry 114 that receives an address (Addr) for accessing the data stored in the array of bitcells 108. The dynamically adjustable pipeline architecture 104 may have dynamic pipeline circuitry 120 that enables a data access pipeline to perform memory access operations in reference to the array of bitcells 108 so as to access the data stored in the memory based on the address (Addr). Also, in various instances, the dynamic pipeline circuitry 120 may be configured to dynamically adjust the data access pipeline during the memory access operations so as to output the data based on the address (Addr). Also, in other instances, the dynamically adjustable pipeline architecture 104 may be referred to as a device having memory circuitry including various components related thereto.

In some implementations, the memory circuitry 104 may include various circuitry such as, e.g., the address decoder 114, the bitcell array 108, sense amplifier (SA) circuitry 124, and output circuitry (FF) 128. The bitcell array 108 may have multiple rows of bitcells, and the sense amplifier circuitry 124 may be coupled to each of the bitcells in each of the rows of bitcells via complementary bitlines (BL, NBL). Also, the bitcell array 108 may have a number of wordlines (WL0, WL1, . . . , WLn) that are coupled between the address decoder 114 and corresponding rows of bitcells in the bitcell array 108 for access to the bitcells based on a selected wordline. Also, each wordline (WL0, WL1, . . . , WLn) may have a corresponding wordline driver coupled thereto to provide wordlines signals by way of the wordlines (WL0, WL1, . . . , WLn) to corresponding rows of bitcells in the bitcell array 108.

Also, in various instances, the memory circuitry 104 may receive multiple input signals, such as, e.g., address signal (Addr), a clock signal (CLK), a sense amplifier enable signal (SAEN), and a clear bit signal (CB). In some instances, the memory circuitry may receive other signals, such as, e.g., an enable signal (EN) and a chip-enable bit signal (CEB).

In some implementations, the address decoder circuitry 114 has a comparator 118 that may be configured to compare a current address to a previous address and an incoming address so as to thereby identify different stages of memory access operations. The address decoder circuitry 114 may perform memory access operations in reference to the bitcell array 108 by way of the wordlines (WL0, WL1, . . . , WLn). The bitcell array 108 may be coupled to the dynamic pipeline circuitry 120 by way of a number of complementary bitlines (BL/BLB), and also, the dynamic pipeline circuitry 120 may have the sense amplifier (SA) circuitry 124 and the output circuitry (FF) 128. As such, in some instances, the bitcells in the bitcell array 108 may be coupled to the sense amplifier (SA) circuitry 124 by way of the bitlines (BL/BLB), and also, the SA circuitry 124 may provide a SA_output signal to the output circuitry (FF) 128 based on the SAEN signal. The output circuitry (FF) 128 may refer to a flip-flop (FF) having a data input (D) and a data output (Q). Further, the SA circuitry 124 may be coupled to a data input (D) of the output circuitry (FF) 128 so as to provide the SA_output signal thereto, and also, the output circuitry (FF) 128 may provide an output signal (Q_output) based on the clock signal (CLK). Also, in various instances, the dynamic pipeline circuitry 120 along with the various components 124, 128 related thereto may operate based the enable signal (EN) and/or the chip enable bit signal (CEB) so as to activate the dynamic pipeline in accordance with various implementations described herein.

In some implementations, as described herein, the dynamically adjustable pipeline architecture 104 may operate as a device that uses the address decoder circuitry 114 along with the comparator 118 that may be configured to compare a current address to a previous address and an incoming address so as to thereby identify different stages of memory access operations. For instance, in a first stage, from a powered-down state, the device 104 may receive the enable signal (EN) that initiates power-up of the memory 108. Also, in the first stage, the device 104 may receive the address (Addr) from an address port of the address decoder circuitry 114, and also, in a second stage after the first stage, the device may power-up at least one wordline (WL0, WL1, . . . , WLn) to perform the memory access operation. Further, in a third stage after the second stage, the device may capture data stored in the memory 108 and send-out the data to the output (Q_output) by way of the data access pipeline. Moreover, at near the end of the third stage, the device 104 may determine whether another memory access operation is impending based on the chip-enable bit (CEB), and in this instance, the chip-enable bit (CEB) may be used to provide the data access pipeline with forehand knowledge that another memory access operation is impending.

In various implementations, in reference to the third stage, if a different address is impending based on the chip-enable bit (CEB), then the device may compare the address to the different address and determine whether a section of the memory 108 that was previously powered-up will be re-used. If previously powered-up, then the device may proceed directly to the second stage so as to perform another memory access operation with the different address. In addition, in the third stage, the device may compare the address to the different address and skip the first stage so as to proceed directly to the second stage.

In the third stage, if a different address is impending based on the chip-enable bit (CEB), then the device may compare the address to the different address and determine whether a section of the memory that was previously powered-up will be re-used. If not previously powered-up, then the device may proceed to the first stage to power-up the memory 108 and then proceed to the second stage to perform another memory access operation with the different address.

In various implementations, in reference to the third stage, if a different address is not impending based on the chip-enable bit CEB), then the device may determine that there is no pending memory access operation and proceed to power-down the memory 108 in a power-down state. In various instances, there may be other stages that may be used.

The memory circuitry may be implemented as an integrated circuit (IC) in various types of memory, such as random access memory (RAM), static RAM (SRAM), magneto-resistive RAM (MRAM), and/or any other similar type of memory. The memory circuitry may be implemented as an IC with single-port memory architecture and related circuitry, and the memory circuitry may also be integrated with computing circuitry and related components on a single chip. The memory circuitry may be implemented in various embedded systems for various automotive, electronic, computer, mobile and IOT applications.

The memory circuitry may have the bitcell array 104 with multiple memory cells (or bitcells) arranged in the array 108. Also, each bitcell may be configured to store at least one data bit value (e.g., a data value related to a logical '0' or '1'). The bitcell array 108 may have any number (N) of bitcells arranged in various applicable configurations, such as, e.g., a two-dimensional (2D) memory array having any number of columns (Ncolumns) and any number of rows (Nrows) with the bitcells arranged in a 2D grid pattern.

Figure 2:
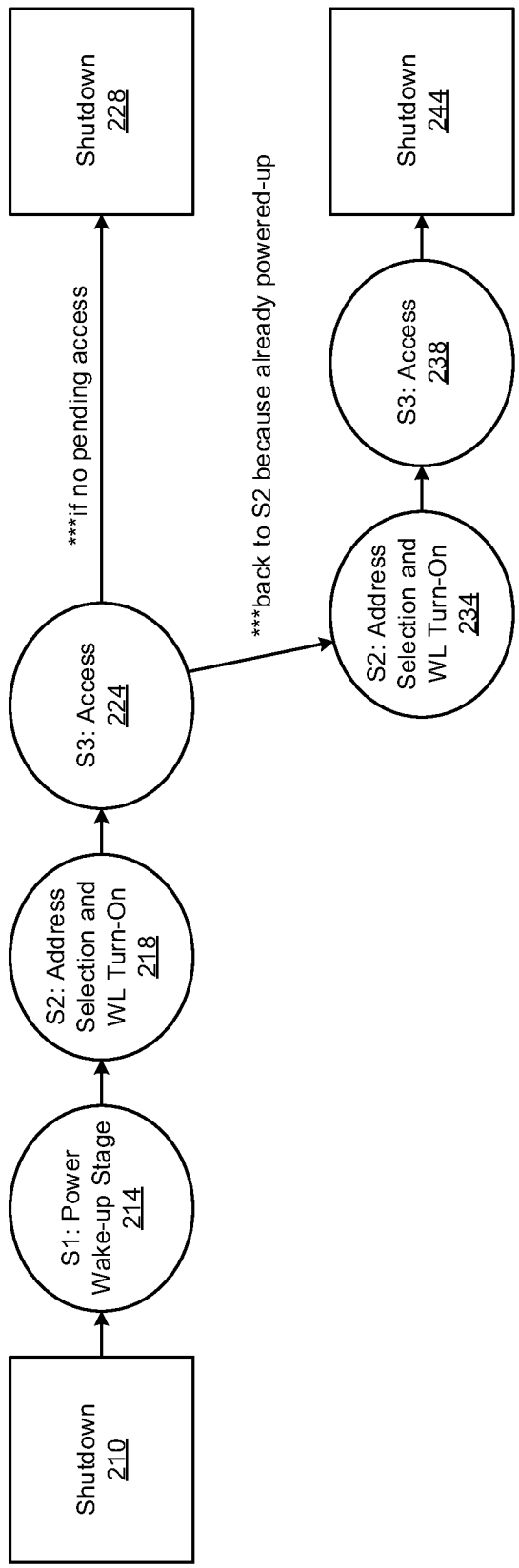
FIG. 2 illustrates a diagram related to a dynamic pipeline technique for memory access in accordance with various implementations described herein.

FIG. 2 illustrates a diagram 200 related to a dynamic pipeline technique 204 for memory access in accordance with various implementations described herein. As described herein, the technique 204 may refer to a process method that uses a dynamically adjustable pipeline for memory access operations, schemes and/or techniques.

It should be understood that even though technique 204 indicates a particular order of operation execution, in some cases, various portions of operations may be executed in a different order, and on different systems. In other cases, additional operations and/or steps may be added to or omitted from technique 204. Also, technique 204 may be implemented in hardware and/or software. For instance, if implemented in hardware, technique 204 may be implemented with various components and/or circuitry, as described in FIG. 1. Also, in other instances, if implemented in software, technique 204 may be implemented in program or software instruction processes that provide a dynamically adjustable pipeline for memory access operations, as described herein. Also, if implemented in software, instructions related to implementing technique 204 may be stored in memory, such as, e.g., a database. Also, in some implementations, a computer or various other types of computing devices with a processor and memory may be configured to perform technique 204.

As described in reference to FIG. 2, technique 204 may be used for fabricating and/or manufacturing, or causing to be fabricated and/or manufactured, an integrated circuit (IC) that implements various schemes and techniques in physical design as described herein so as to thereby provide the dynamically adjustable pipeline architecture for memory access using various devices, components and/or circuitry as described herein.

In some implementations, the dynamic pipeline technique 204 may be dynamically adjustable so as to thereby operate as a method that may be configured to compare a current address to a previous address and an incoming address by utilizing various different stages of memory access operations. In some instances, the stages may include a first stage (S1), a second stage (S2), a third stage (S3) and/or various additional stages. In various instances, the memory access operations may refer to read-write operations, wherein during the read-write operations, and based on the address, the data access pipeline is dynamically adjusted during the memory access operations. In addition, the output of the memory may dynamically update or change based on the address.

At block 210, technique 204 may begin in a shutdown mode 210. At block 214, in reference to the first stage (S1), from a powered-down state, the technique 204 may receive an enable signal (e.g., EN) that initiates power-up (or wake-up) of the memory 108. Also, in the first stage (S1), the technique 204 may receive the address (e.g., Addr) from an address port. The first stage (S1) may be referred to as a power wake-up stage, or similar. At block 218, in reference to the second stage (S2), after the first stage (S1), the technique 204 may power-up at least one wordline (e.g., at least one of WL0, WL1, . . . , WLn) so as to perform a memory access operation. Also, in the second stage (S2), the technique 204 may select the address (e.g., Addr) based on one or more addresses received at the address port, and the second stage (S2) may be referred to as a wordline (WL) turn-on stage. Further, in some instances, in stage two (S2), the technique 204 may receive the address (e.g., Addr) that may be used to access the data stored in the memory 108.

At block 224, in reference to the third stage (S3), after the second stage (S2), the technique 204 may capture data stored in the memory 108 and send-out data to the output (e.g., Q_output) by way of a data access pipeline. Also, in the third stage (S3), the technique 204 may enable the data access pipeline to thereby perform memory access operations so as to access the data stored in the memory 108 based on the address (Addr). Also, in the third stage (S3), the technique 204 may dynamically adjust the data access pipeline during memory access operations so as to output the data based on the address (e.g., Addr). Also, at the end of the third stage (S3), the technique 204 may determine whether another memory access operation is impending based on the chip-enable bit (e.g., CEB). In some instances, the chip-enable bit (CEB) may provide the data access pipeline with forehand knowledge of whether another memory access operation is impending.

In some implementations, at block 228, in the third stage (S3), if a different address is not impending (i.e., if no pending address) based on the chip-enable bit (e.g., CEB), then the technique 204 may determine that there is no pending memory access operation so as to thereby proceed to block 228 for power-down (or shutdown) the memory 108 in a power-down state (or shutdown state).

In other implementations, at block 234, in the third stage (S3), if a different address is impending based on the chip-enable bit (e.g., CEB), then the technique 204 may compare (e.g., with comparator 118) the address (e.g., Addr) to the different address and determine whether a section of the memory 108 that was previously powered-up will be re-used. Also, if previously powered-up, then the technique 204 may proceed directly to the second stage (S2) so as to perform another memory access operation with the different address. Further, in the third stage (S3), the technique 204 may then compare (e.g., with the comparator 118) the address (e.g., Addr) to the different address so as to skip the first stage (S1) to thereby proceed directly to the second stage (S2). At block 238, in the third stage (S3), the technique 204 may enable the data access pipeline to perform memory access operations so as to access the data stored in the memory 108 based on the address (Addr). Also, at block 238, the technique 204 may dynamically adjust the data access pipeline during memory access operations so as to output data based on the address (e.g., Addr).

In other implementations, at block 234, in the third stage (S3), if a different address is impending based on the chip-enable bit (e.g., CEB), then the technique 204 may compare (e.g., with comparator 118) the address (e.g., Addr) to the different address so as to thereby determine whether a section of the memory 108 that was previously powered-up will be re-used. In this instance, if not previously powered-up, then the technique 204 may proceed to the first stage (S1) to power-up the memory 108 and then proceed to the second stage (S2) to perform another memory access operation with the different address. At block 238, in the third stage (S3), the technique 204 may enable the data access pipeline to perform memory access operations so as to access the data stored in the memory 108 based on the address (Addr). Further, the technique 204 may dynamically adjust the data access pipeline during memory access operations so as to output data based on the address (e.g., Addr).

In some implementations, at block 244, in the third stage (S3), if a different address is not impending (i.e., if no pending address) based on the chip-enable bit (e.g., CEB), then the technique 204 may determine that there is no pending memory access operation so as to thereby proceed to block 228 for power-down (or shutdown) the memory 108 in a power-down state (or shutdown state).

In some implementations, the data may refer to multi-bit data, wherein the memory 108 refers to the array of bitcells that are configured to store the multi-bit data. Also, in some instances, the array of bitcells may be arranged in columns and rows, and each column of the columns may be configured to provide at least one bit of data of the multi-bit data stored in the array of bitcells. Further, in some instances, the memory access operations may refer to data-bit clearing operations, wherein during these clearing operations, and also based on the address (e.g., Addr), the technique 204 may perform an invalidate operation by clearing at least one bit on a wordline (WL) based on the clear-bit signal (CB).

Figure 3:
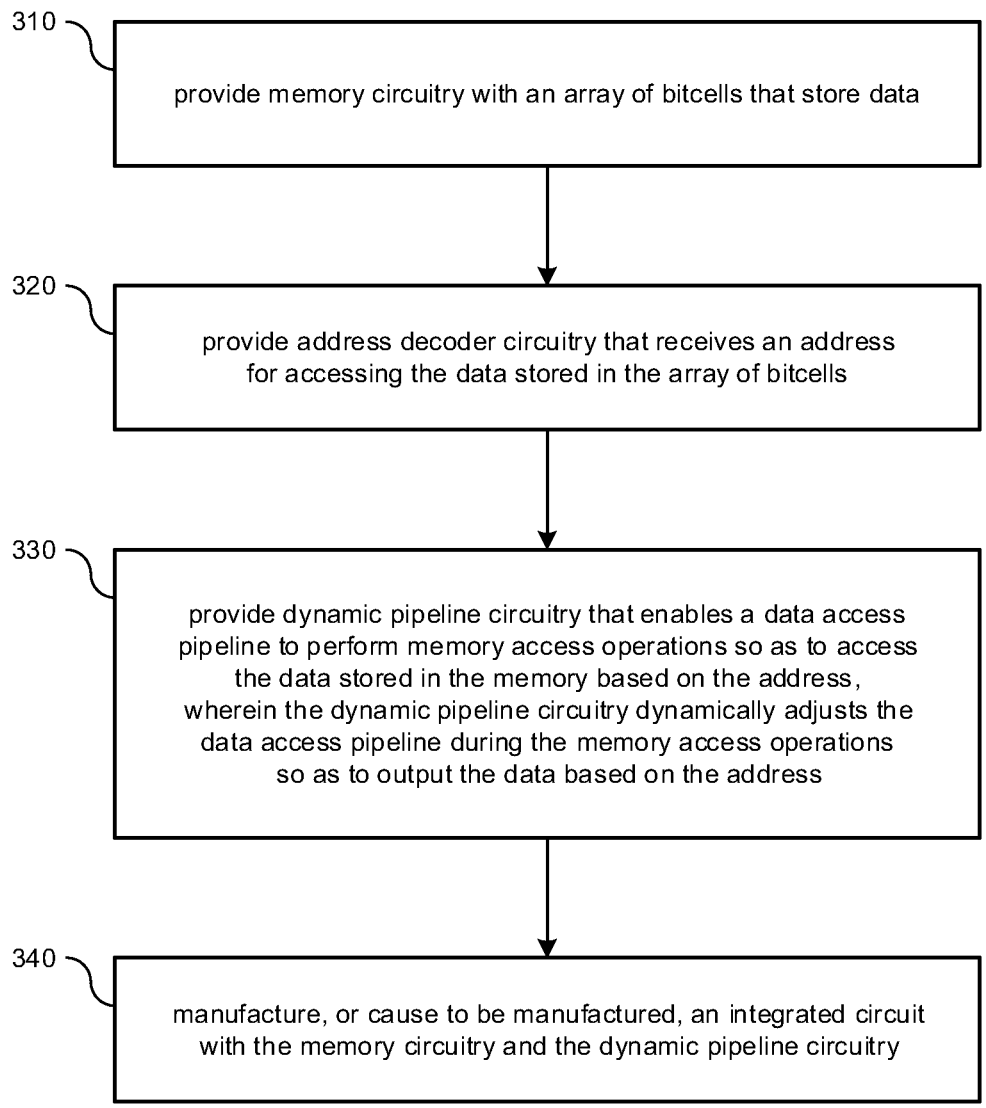
FIG. 3 illustrates a diagram of a method for providing dynamically adjustable pipeline architecture in accordance with various implementations described herein.

FIG. 3 illustrates a diagram of a method 300 for providing dynamically adjustable pipeline architecture in accordance with various implementations described herein. Also, as described herein, method 300 may be used so as to provide dynamically adjustable pipeline circuitry for memory access operations, schemes and/or techniques.

It should be understood that even though method 300 indicates a particular order of operation execution, in some cases, various portions of operations may be executed in a different order, and on different systems. In other cases, additional operations and/or steps may be added to and/or omitted from method 300. Also, method 300 may be implemented in hardware and/or software. For instance, if implemented in hardware, method 300 may be implemented with various components and/or circuitry, as described in FIGS. 1-2. Also, in other instances, if implemented in software, method 300 may be implemented as a program or software instruction process that provides dynamically adjustable pipeline architecture for memory access operations, as described herein. Also, if implemented in software, various instructions related to implementing method 300 may be stored in memory, such as, e.g., a database. Also, in some implementations, a computer or various other types of computing devices with a processor and memory may be configured to perform method 300.

As described in reference to FIG. 3, the method 300 may be used for fabricating and/or manufacturing, or causing to be fabricated and/or manufactured, an integrated circuit (IC) that implements various schemes and techniques in physical design as described herein so as to thereby provide the dynamically adjustable pipeline architecture for memory access using various devices, components and/or circuitry as described herein.

At block 310, method 300 may provide memory circuitry with an array of bitcells that store data. Also, at block 320, method 300 may provide address decoder circuitry that receives an address for accessing the data stored in the array of bitcells. Also, at block 330, method 300 may provide dynamic pipeline circuitry that enables a data access pipeline to perform memory access operations so as to access the data stored in the memory based on the address. In some implementations, the dynamic pipeline circuitry may be configured to dynamically adjust (or adapt, or modify, or regulate) the data access pipeline during the memory access operations so as to output the data based on the address. Further, at block 340, method 300 may manufacture, or cause to be manufactured, an integrated circuit with the memory circuitry and the dynamic pipeline circuitry.

In some implementations, the memory access operations may refer to read-write operations, and during the read-write operations, and based on the address, the data access pipeline may be dynamically adjusted during the memory access operations. The output of the memory dynamically may update or change based on the address. Moreover, in other implementations, the memory access operations may refer to clearing operations, and during the clearing operations, and based on the address, method 300 may perform an invalidate operation by clearing a bit on a wordline based on a clear-bit signal.

In some implementations, in a first stage, from a powered-down state, the method may receive an enable signal that initiates power-up of the memory, and in the first stage, method 300 may receive the address from an address port. Also, in a second stage after the first stage, method 300 may power-up at least one wordline to perform the memory access operation. Further, in a third stage after the second stage, method 300 may capture data stored in the memory and send-out the data to the output by way of the data access pipeline, and at an end of the third stage, method 300 may determine whether another memory access operation is impending based on a chip-enable bit. Moreover, in some instances, the chip-enable bit may provide the data access pipeline with forehand knowledge that another memory access operation is impending.

In some instances, in the third stage, if a different address is impending based on the chip-enable bit, then method 300 may compare the address to the different address and determine whether a section of the memory that was previously powered-up will be re-used. Also, if previously powered-up, then method 300 proceeds directly to the second stage so as to perform another memory access operation with the different address. Further, in the third stage, method 300 may compare the address to the different address and skip the first stage so as to proceed directly to the second stage.

In some instances, in the third stage, if a different address is impending based on the chip-enable bit, then method 300 may compare the address to the different address and determines whether a section of the memory that was previously powered-up will be re-used. Also, if not previously powered-up, then method 300 may proceed to the first stage to power-up the memory and then proceed to the second stage to perform another memory access operation with the different address.

In some instances, in the third stage, if a different address is not impending based on the chip-enable bit, then method 300 may determine that there is no pending memory access operation and proceeds to power-down the memory in a power-down state. Also, the data may refer to multi-bit data, and further, the memory may refer to an array of bitcells that are configured to store the multi-bit data. Also, in some instances, the array of bitcells may be arranged in columns and rows, and further, each column of the columns may provide at least one bit of data of the multi-bit data stored in the array of bitcells.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may receive an address to access data stored in memory. The method may enable a data access pipeline to perform memory access operations so as to access the data stored in the memory based on the address. The method may dynamically adjust the data access pipeline during the memory access operations so as to output the data based on the address.

Described herein are various implementations of a device having memory circuitry with an array of bitcells that store data. The device may have address decoder circuitry that receives an address for accessing the data stored in the array of bitcells. The device may have dynamic pipeline circuitry that enables a data access pipeline to perform memory access operations so as to access the data stored in the memory based on the address. The dynamic pipeline circuitry may be configured to dynamically adjust the data access pipeline during the memory access operations so as to output the data based on the address.

Described herein are various implementations of a method. The method may provide memory circuitry with an array of bitcells that store data. The method may provide address decoder circuitry that receives an address for accessing the data stored in the array of bitcells. The method may provide dynamic pipeline circuitry that enables a data access pipeline to perform memory access operations so as to access the data stored in the memory based on the address. The dynamic pipeline circuitry may dynamically adjust the data access pipeline during the memory access operations so as to output the data based on the address. The method may manufacture, or cause to be manufactured, an integrated circuit with the memory circuitry and the dynamic pipeline circuitry.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A method comprising:
receiving an address to access data stored in memory;
enabling a data access pipeline to perform memory access operations so as to access the data stored in the memory based on the address, wherein the memory access operations include read-write operations;
dynamically adjusting the data access pipeline during the read-write operations so as to output the data based on the address; and
determining whether additional memory access operations are impending based on a chip-enable bit.

2. The method of claim 1, wherein:
in a first stage, from a powered-down state, the method receives an enable signal that initiates power-up of the memory, and
in the first stage, the method receives the address from an address port.

3. The method of claim 2, wherein:
in a second stage after the first stage, the method powers-up at least one wordline to perform the memory access operation,
in a third stage after the second stage, the method captures data stored in the memory and sends-out the data to the output by way of the data access pipeline, and
in the third stage, the method determines whether the additional memory access operations are impending based on the chip-enable bit.

4. The method of claim 1, wherein the data refers to multi-bit data, wherein the memory refers to an array of bitcells that are configured to store the multi-bit data.

5. The method of claim 4, wherein:
the array of bitcells is arranged in columns and rows, and
each column of the columns provides at least one bit of data of the multi-bit data stored in the array of bitcells.

6. A method comprising:
dynamically adjusting a data access pipeline during memory access operations so as to output data stored in memory based on an address; and
determining whether additional memory access operations are impending based on a chip-enable bit, wherein:
the memory access operations refer to read-write operations,
during the read-write operations, and based on the address, the data access pipeline is dynamically adjusted during the memory access operations, and
the output of the memory dynamically updates or changes based on the address.

7. A method comprising:
receiving an address to access data stored in memory;
enabling a data access pipeline to perform memory access operations so as to access the data stored in the memory based on the address; and
dynamically adjusting the data access pipeline during the memory access operations so as to output the data based on the address, wherein:
in a first stage, from a powered-down state, the method receives an enable signal that initiates power-up of the memory,
in the first stage, the method receives the address from an address port,
in a second stage after the first stage, the method powers-up at least one wordline to perform the memory access operation,
in a third stage after the second stage, the method captures data stored in the memory and sends-out the data to the output by way of the data access pipeline, and
at an end of the third stage, the method determines whether another memory access operation is impending based on a chip-enable bit.

8. The method of claim 7, wherein:
the chip-enable bit provides the data access pipeline with forehand knowledge of the another memory access operation is impending.

9. The method of claim 7, wherein:
in the third stage, if a different address is impending based on the chip-enable bit, then the method compares the address to the different address and determines whether a section of the memory that was previously powered-up will be re-used, and if previously powered-up, then the method proceeds directly to the second stage so as to perform another memory access operation with the different address.

10. The method of claim 9, wherein:

in the third stage, the method compares the address to the different address and skips the first stage so as to proceed directly to the second stage.

11. The method of claim 7, wherein:

in the third stage, if a different address is impending based on the chip-enable bit, then the method compares the address to the different address and determines whether a section of the memory that was previously powered-up will be re-used, and if not previously powered-up, then the method proceeds to the first stage to power-up the memory and then proceeds to the second stage to perform another memory access operation with the different address.

12. The method of claim 7, wherein:

in the third stage, if a different address is not impending based on the chip-enable bit, then the method determines that there is no pending memory access operation and proceeds to power-down the memory in a power-down state.

13. A method comprising:

receiving an address to access data stored in memory;

enabling a data access pipeline to perform memory access operations so as to access the data stored in the memory based on the address; and dynamically adjusting the data access pipeline during the memory access operations so as to output the data based on the address, wherein:

the memory access operations refer to clearing operations, and during the clearing operations, and based on the address, the method performs an invalidate operation by clearing a bit on a wordline based on a clear-bit signal.

14. A method comprising:

providing memory circuitry with an array of bitcells that store data;

providing address decoder circuitry that receives an address for accessing the data stored in the array of bitcells, wherein accessing the data includes read-write operations;

providing dynamic pipeline circuitry that enables a data access pipeline to perform the read-write operations so as to access the data stored in the memory based on the address, wherein the dynamic pipeline circuitry dynamically adjusts the data access pipeline during the read-write operations so as to output the data based on the address, and wherein the dynamic pipeline circuitry determines whether additional memory access operations are impending based on a chip-enable bit; and manufacturing, or causing to be manufactured, an integrated circuit with the memory circuitry and the dynamic pipeline circuitry.

* * * * *